United States Patent
Jang et al.

(10) Patent No.: US 10,931,400 B2
(45) Date of Patent: Feb. 23, 2021

(54) DECODING METHOD AND APPARATUS IN WIRELESS COMMUNICATION SYSTEM

(71) Applicant: Samsung Electronics Co., Ltd, Suwon-si (KR)

(72) Inventors: Min Jang, Seongnam-si (KR); Woo-Myoung Park, Suwon-si (KR); Jae-Yoel Kim, Seongnam-si (KR); Seok-Ki Ahn, Suwon-si (KR); Chi-Woo Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 255 days.

(21) Appl. No.: 15/774,963

(22) PCT Filed: Nov. 9, 2016

(86) PCT No.: PCT/KR2016/012864
§ 371 (c)(1),
(2) Date: May 9, 2018

(87) PCT Pub. No.: WO2017/082626
PCT Pub. Date: May 18, 2017

(65) Prior Publication Data
US 2018/0351693 A1    Dec. 6, 2018

(30) Foreign Application Priority Data

Nov. 9, 2015  (KR) .................. 10-2015-0156730

(51) Int. Cl.
*H04L 1/00*     (2006.01)
*H03M 13/13*    (2006.01)
(Continued)

(52) U.S. Cl.
CPC .......... *H04L 1/0045* (2013.01); *H03M 13/13* (2013.01); *H03M 13/45* (2013.01); *H03M 13/6561* (2013.01); *H04L 1/0057* (2013.01)

(58) Field of Classification Search
CPC .... H04L 1/0045; H04L 1/0057; H03M 13/13; H03M 13/45; H03M 13/6561
See application file for complete search history.

(56) References Cited

U.S. PATENT DOCUMENTS

| 2004/0017855 | A1  | 1/2004 | Otsuka |
| 2012/0054576 | A1* | 3/2012 | Gross ................. H03M 13/1117 714/752 |

(Continued)

FOREIGN PATENT DOCUMENTS

| CN | 103220001 A | 7/2013 |
| CN | 104124979 A | 10/2014 |

(Continued)

OTHER PUBLICATIONS

Zhang et al., Iterative multistage decoding of polar code based multilevel codes, IEEE, Conference Paper, pp. 2021-2026 (Year: 2014).*

(Continued)

*Primary Examiner* — April Y Blair
*Assistant Examiner* — Dipakkumar B Gandhi

(57) ABSTRACT

The present disclosure relates to a 5G or pre-5G communication system for supporting a higher data transmission rate beyond the 4G communication system such as LTE. A decoding method using a polar code according to an embodiment of the present disclosure comprises the steps of: determining a first function for decoding input bits and a second function, which is independent from a log likelihood ratio (LLR) value of a previous input bit by the first function; and decoding the input bits in parallel using the first function and the second function. Also, the method comprises the (Continued)

steps of: determining an internal frozen bit using at least one input frozen bit which has a predetermined value of a predetermined position from among the input bits; and determining LLR values for layer bits sequentially from the higher layers of N layers.

14 Claims, 12 Drawing Sheets

(51) Int. Cl.
*H03M 13/45* (2006.01)
*H03M 13/00* (2006.01)
*H04L 7/00* (2006.01)

(56) References Cited

U.S. PATENT DOCUMENTS

| | | | | |
|---|---|---|---|---|
| 2013/0117344 | A1* | 5/2013 | Gross | G06F 17/10 |
| | | | | 708/490 |
| 2014/0019820 | A1* | 1/2014 | Vardy | H03M 13/13 |
| | | | | 714/752 |
| 2014/0208183 | A1* | 7/2014 | Mahdavifar | H03M 13/296 |
| | | | | 714/755 |
| 2014/0365842 | A1* | 12/2014 | Li | H03M 13/09 |
| | | | | 714/752 |
| 2015/0263767 | A1 | 9/2015 | Shin et al. | |
| 2015/0381208 | A1 | 12/2015 | Li et al. | |

FOREIGN PATENT DOCUMENTS

| | | |
|---|---|---|
| KR | 10-2015-0106270 A | 9/2015 |
| KR | 10-2015-0122757 A | 11/2015 |

OTHER PUBLICATIONS

International Search Report dated Feb. 9, 2017 in connection with International Patent Application No. PCT/KR2016/012864.

Written Opinion of the International Searching Authority dated Feb. 9, 2017 in connection with International Patent Application No. PCT/KR2016/012864.

* cited by examiner

DECODING METHOD AND APPARATUS IN WIRELESS COMMUNICATION SYSTEM

CROSS-REFERENCE TO RELATED APPLICATIONS AND CLAIM OF PRIORITY

This application is a 371 of International Application No. PCT/KR2016/012864 filed Nov. 9, 2016, which claims priority to Korean Patent Application No. 10-2015-0156730 filed Nov. 9, 2015, the disclosures of which are herein incorporated by reference in their entirety.

BACKGROUND

1. Field

The present disclosure relates to decoding methods and apparatuses using polar codes in wireless communication systems.

2. Description of Related Art

In order to meet the demand for wireless data traffic soaring since the 4G communication system came to the market, there are ongoing efforts to develop enhanced 5G communication systems or pre-5G communication systems. For the reasons, the 5G communication system or pre-5G communication system is called the beyond 4G network communication system or post LTE system.

For higher data transmit rates, 5G communication systems are considered to be implemented on ultra-high frequency bands (mmWave), such as, e.g., 60 GHz. To mitigate path loss on the ultra-high frequency band and increase the reach of radio waves, the following techniques are taken into account for the 5G communication system: beamforming, massive multi-input multi-output (MIMO), full dimensional MIMO (FD-MIMO), array antenna, analog beamforming, and large-scale antenna.

Also being developed are various technologies for the 5G communication system to have an enhanced network, such as evolved or advanced small cell, cloud radio access network (cloud RAN), ultra-dense network, device-to-device (D2D) communication, wireless backhaul, moving network, cooperative communication, coordinated multi-point (CoMP), and interference cancellation.

There are also other various schemes under development for the 5G system including, e.g., hybrid FSK and QAM modulation (FQAM) and sliding window superposition coding (SWSC), which are advanced coding modulation (ACM) schemes, and filter bank multi-carrier (FBMC), non-orthogonal multiple access (NOMA) and sparse code multiple access (SCMA), which are advanced access schemes.

Meanwhile, the Internet is evolving from the human-centered connection network by which humans create and consume information to the Internet of Things (IoT) network by which information is communicated and processed between things or other distributed components. The Internet of Everything (IoE) technology may be an example of a combination of the Big data processing technology and the IoT technology through, e.g., a connection with a cloud server.

To implement the IoT, technology elements, such as a sensing technology, wired/wireless communication and network infra, service interface technology, and a security technology, are required. There is a recent ongoing research for inter-object connection technologies, such as the sensor network, Machine-to-Machine (M2M), or the Machine-Type Communication (MTC).

In the IoT environment may be offered intelligent Internet Technology (IT) services that collect and analyze the data generated by the things connected with one another to create human life a new value. The IoT may have various applications, such as the smart home, smart building, smart city, smart car or connected car, smart grid, health-care, or smart appliance industry, or state-of-art medical services, through conversion or integration of existing IT technologies and various industries.

Thus, there are various ongoing efforts to apply the 5G communication system to the IoT network. For example, the sensor network, machine-to-machine (M2M), machine type communication (MTC), or other 5G techniques are implemented by schemes, such as beamforming, multi-input multi-output (MIMO), and array antenna schemes. The above-mentioned application of the cloud radio access network as a Big data processing technique may be said to be an example of the convergence of the 5G and IoT technologies.

Anticipated for 5G communication systems are services with various requirements, such as services requiring high-volume, high-speed transmission, e.g., video streaming, virtual reality or augmented reality services, and services requiring short packets and lower power consumption for cellular Internet of things (CIoT), e.g., smart metering, health-care monitoring, fleet control, and wearable devices.

Low-density parity-check codes (LDPCs) and turbo codes, which are channel codes currently available in LTE, Wi-Fi, and broadcast enable an implementation of user equipments (UEs) to process high-speed data with a very superior performance that nearly approaches the theoretical channel capacity for large-size packets information bits of which are as long as about 1000 bits or longer. Accordingly, turbo codes and LDPCs are encoding codes appropriate for high-end services requiring high-volume, high-speed transmissions.

However, turbo codes and LDPCs, by their nature, may be significantly deteriorated as compared with the theoretical channel capacity for packets information bits of which are a few tens through a few hundreds of bits long. Further, because of being decoded via use of recursive decoding scheme, the codes, although able to secure a superior performance on large-size packets, may increase the complexity in implementing decoders and cause significant power consumption in decoders. Accordingly, existing turbo codes and LDPCs might not fit for data transmission of short packets.

Polar codes, since first proposed by E. Arikan in 2008, have thus far been significantly influencing code theory fields by first verifying that the theoretical capacity can be achieved on binary symmetric channels with reduced encoding/decoding complexity. The first polar codes proposed were in the non-systematic form, and a scheme for creating systematic polar codes in a simple manner has been proposed by E. Arikan in 2011 (U.S. Pat. Nos. 8,347,186, 9,059,739).

Until relatively nowadays, however, polar codes could not attract significant attention in the industry. The reason is that: first, successive cancellation (SC) decodes used in decoding using polar codes may cause a drastic performance deterioration as compared with existing turbo/LDPC codes in a limited length (a few hundreds of thousands of bits or less); and second, the SC decoding scheme is serially implemented, resulting in a significant delay time upon decoding.

Since the polar codes have first been published, many scholastic research efforts have been made to resolve the above issues. In 2011, A. Vardy and I. Tal in UCSD have proposed an SC-List decoder+CRC scheme (US20140019820), publishing very critical conclusions to address the first issue. Application of this scheme proved that polar codes present a more superior performance (maximally 1 dB) than turbo codes and LDPCs particularly in areas (a few tens through a few thousands of bits) where the information bits are not long.

Meanwhile, SC decoders by Arikan's scheme first proposed have a latency of O(N*log N). There are thus far many research outcomes to address this. Among them are semi-parallel SC decoders proposed by Gross, Vardy, etc. (US20130117344), simplified SC (SSC) decoders proposed by Alamdar-Yazdi and Kschischang, and fast-SSC decoders proposed by Gross, Vardy, etc. However, all existing SC decoder-based algorithms have a latency of O(N) or more.

SUMMARY

According to the present disclosure, there are provided decoding methods and apparatuses with the decoding latency minimized using polar codes in wireless communication systems.

According to the present disclosure, there are provided methods and apparatuses for decoding, in parallel, bits using polar codes in wireless communication systems.

According to the present disclosure, there are provided methods and apparatuses for decoding by adaptively adjusting bits to be decoded in parallel considering memory and latency using polar codes in wireless communication systems.

According to an embodiment of the present disclosure, a decoding method using a polar code comprises determining a first function for decoding input bits and a second function that is not dependent upon a log likelihood ratio (LLR) value of a prior input bit by the first function and decoding, in parallel, the input bits using the first function and the second function. Further, the decoding method comprises determining an internal frozen bit using at least one input frozen bit having a predetermined value in a predetermined position among the input bits and determining the LLR values for the bits of the layer sequentially from higher layers among the N layers.

According to an embodiment of the present disclosure, a receiver configured to perform decoding using a polar code comprises a controller configured to determine a first function for decoding input bits and a second function that is not dependent upon a log likelihood ratio (LLR) value of a prior input bit by the first function and a decoder configured to decode, in parallel, the input bits using the first function and the second function. The decoder is configured to determine an internal frozen bit using at least one input frozen bit having a predetermined value in a predetermined position among the input bits and determine the LLR values for the bits of the layer sequentially from higher layers among the N layers.

DETAILED DESCRIPTION

Figure 1:
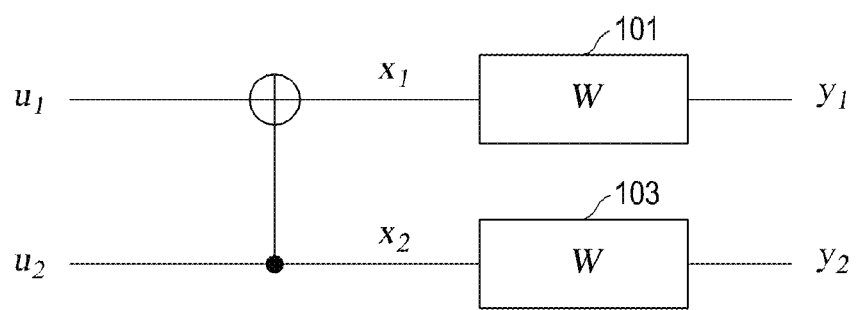
FIG. 1 is a view illustrating a scheme for generating two-bit long polar codes.

When determined to make the subject matter of the present disclosure unclear, the detailed of the known functions or configurations may be skipped. Hereinafter, embodiments of the present disclosure are described in detail with reference to the accompanying drawings.

Although the embodiments described below are separate from one another for ease of description, at least two or more of the embodiments may be combined together within such a range where they do not conflict one another.

The terms described below are defined considering the functions in embodiments of the present disclosure and may be replaced with other terms according to the intention or practice of the user or operator. Therefore, the terms should be defined based on the overall disclosure.

Various changes may be made to the present disclosure, and the present disclosure may come with a diversity of embodiments. Some embodiments of the present disclosure are shown and described in connection with the drawings. However, it should be appreciated that the present disclosure is not limited to the embodiments, and all changes and/or equivalents or replacements thereto also belong to the scope of the present disclosure.

The terms coming with ordinal numbers such as 'first' and 'second' may be used to denote various components, but the components are not limited by the terms. The terms are used only to distinguish one component from another. For example, a first component may be denoted a second component, and vice versa without departing from the scope of the present disclosure. The term "and/or" may denote a combination(s) of a plurality of related items as listed or any of the items.

The terms as used herein are provided merely to describe some embodiments thereof, but not to limit the present disclosure. It is to be understood that the singular forms "a," "an," and "the" include plural references unless the context clearly dictates otherwise. It will be further understood that the terms "comprise" and/or "have," when used in this specification, specify the presence of stated features, integers, steps, operations, elements, and/or components, but do not preclude the presence or addition of one or more other features, integers, steps, operations, elements, components, and/or groups thereof.

An apparatus and method as proposed according to the present disclosure may be applicable to various communication systems, such as long-term evolution (LTE) mobile communication systems, long-term evolution-advanced (LTE-A) mobile communication systems, high speed downlink packet access (HSDPA) mobile communication systems, high speed uplink packet access (HSUPA) mobile communication systems, 3rd generation project partnership 2 (3GPP2) high rate packet data (HRPD) mobile communication systems, 3GPP2 wideband code division multiple access (WCDMA) mobile communication systems, 3GPP2 code division multiple access (CDMA) mobile communication systems, Institute of electrical and electronics engineers (IEEE) 802.16m communication systems, evolved packet systems (EPSs), and mobile Internet protocol (Mobile IP) systems.

Before describing the present disclosure, polar codes are described for a better understanding.

FIG. 1 is a view illustrating a scheme for generating two-bit long polar codes.

Polar codes, as self-explanatory, are polarized in their channel capacity. Channel polarization is described below with reference to FIGS. 1 to 4.

FIG. 1 shows a model under the assumption that when a transmitter sends two bits information $(x_1, x_2)$, a receiver receives $(y_1, y_2)$ through two binary input channels W(101, 103) that are the same. Since the two channels 101 and 103 are the same, their respective channel capacities are the same.

The two same channels 101 and 103 may be converted into two different binary input channels $W_2^{(1)}$ and $W_2^{-(2)}$ by channel combining and channel splitting. At this time, before information $(u_1, u_2)$ is sent by the transmitter in FIG. 1, a particular function G 105, which is called "polarization kernel," is used to encode the information with $(x_1, x_2)$, and data is sent. At this time, $(u_1, u_2)$ and $(x_1, x_2)$ has the relationship represented in Equation 1 below.

$$x_1 = u_1 + u_2$$

$$x_2 = u_2 \quad \text{[Equation 1]}$$

By Equation 1 above, a new vector channel with two-bit inputs and two-bit outputs may be defined as represented in Equation 2. Such process is referred to as channel combining.

$$W_2(y_1, y_2 | u_1, u_2) = W(y_1 | u_1 \oplus u_2) W(y_2 | u_2) \quad \text{[Equation 2]}$$

Two channels, one for $u_1$ and the other for $u_2$, may be obtained by converting the channel-combined channels into binary input channels as represented in Equation 3. This is called channel splitting.

$$W^-(y_1, y_2 | u_1) = \frac{1}{2} \sum_{u_2} W_2(y_1, y_2 | u_1, u_2) \quad \text{[Equation 3]}$$

$$W^+(y_1, y_2, u_1 | u_2) = \frac{1}{2} W_2(y_1, y_2 | u_1, u_2)$$

The two channels, $w_2^{(1)}$ and $W_2^{-(2)}$, newly generated via channel splitting have characteristics as represented in Equation 4.

$$2I(W) = I(W^-) + I(W^+)$$

$$I(W^-) \leq I(W) \leq I(W^+) \quad \text{[Equation 4]}$$

That is, new channels as represented in Equation 3 may be obtained by converting the original channels 101 and 103 by the above processes. At this time, such a phenomenon occurs where the capacity of some channel shifts to the other channels while the overall channel capacity remains. As such, the phenomenon that the capacity of one channel shifts to another is called "channel polarization." For example, where channel combining and channel splitting are performed on two original channels 101 and 103 each having a channel capacity of 0.5, the first channel $W_2^{(1)}$ newly generated may have a capacity of 1, and the second channel $W_2^{(2)}$ newly generated may have a capacity of 0. As such, as a result of channel polarization, the channel capacity of a half of the channels newly generated becomes larger than the original while the channel capacity of the other half becomes smaller than the original.

Meanwhile, repeating the processes n times produces a total of $N=2^n$ binary input channels. The ith channel among the N channels thus generated may be defined as represented in Equation 5.

$$W_N^{(i)}(y_1^N, u_1^{i-1} | u_i) = \frac{1}{2^{N-1}} \sum_{u_{i-1}^N \in \{0,1\}^{N-1}} \quad \text{[Equation 5]}$$

$$W_N(y_1^N | u_1^N) = \frac{1}{2^{N-1}} \sum_{u_{i-1}^N \in \{0,1\}^{N-1}} W^N(y_1^N | u_1^N, G_N)$$

Figure 2:
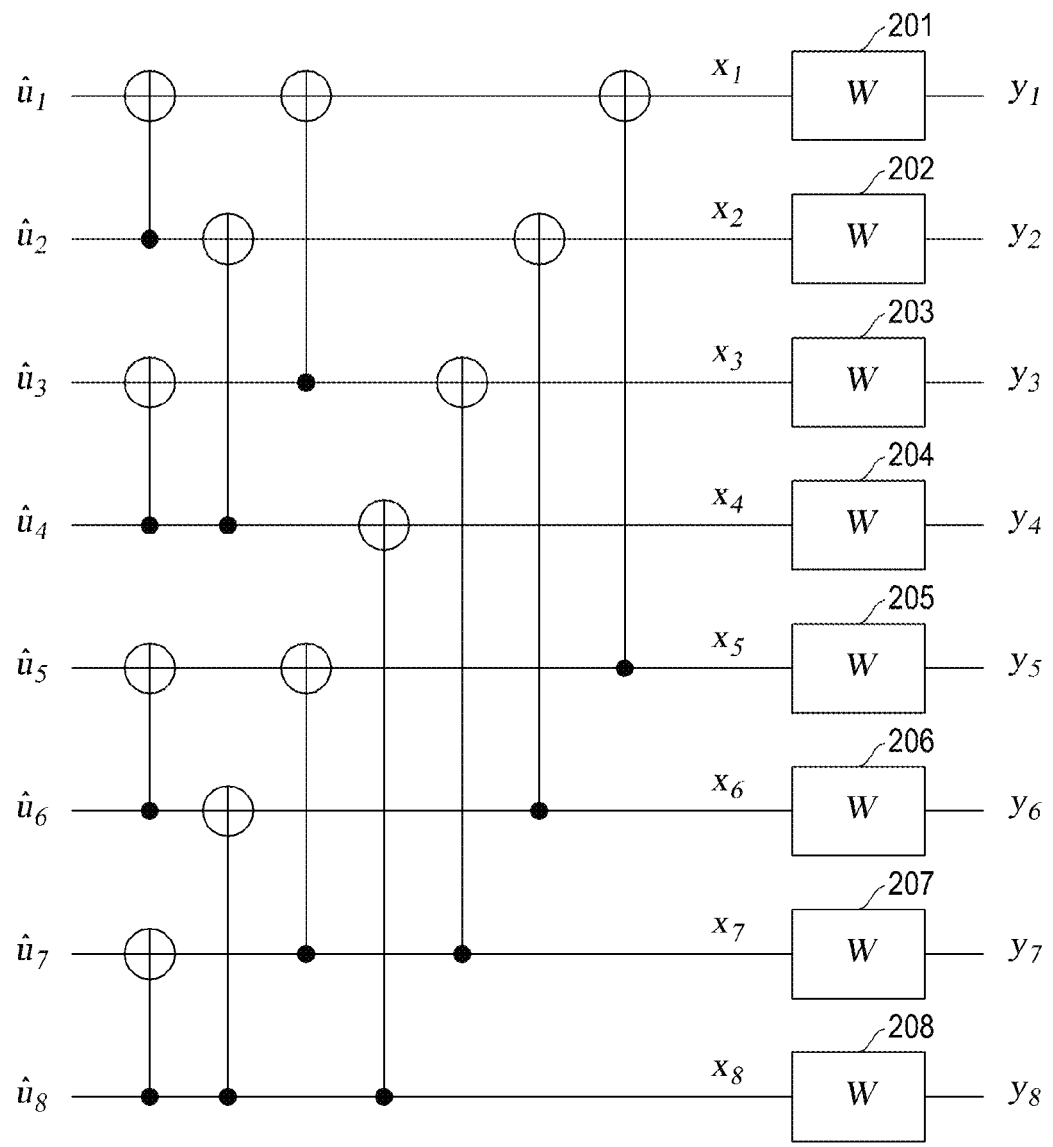
FIG. 2 is a view illustrating a polar code when channel combining and channel splitting are repeated three times.

FIG. 2 is a view illustrating a polar code when channel combining and channel division are repeated three times.

Repeating channel combining and channel splitting as per the structure shown in FIG. 2, eight polarized channels with a similar form to that represented in Equation 3 may be generated from eight channels 201 to 208 having the same channel capacity at the beginning.

Figure 3:
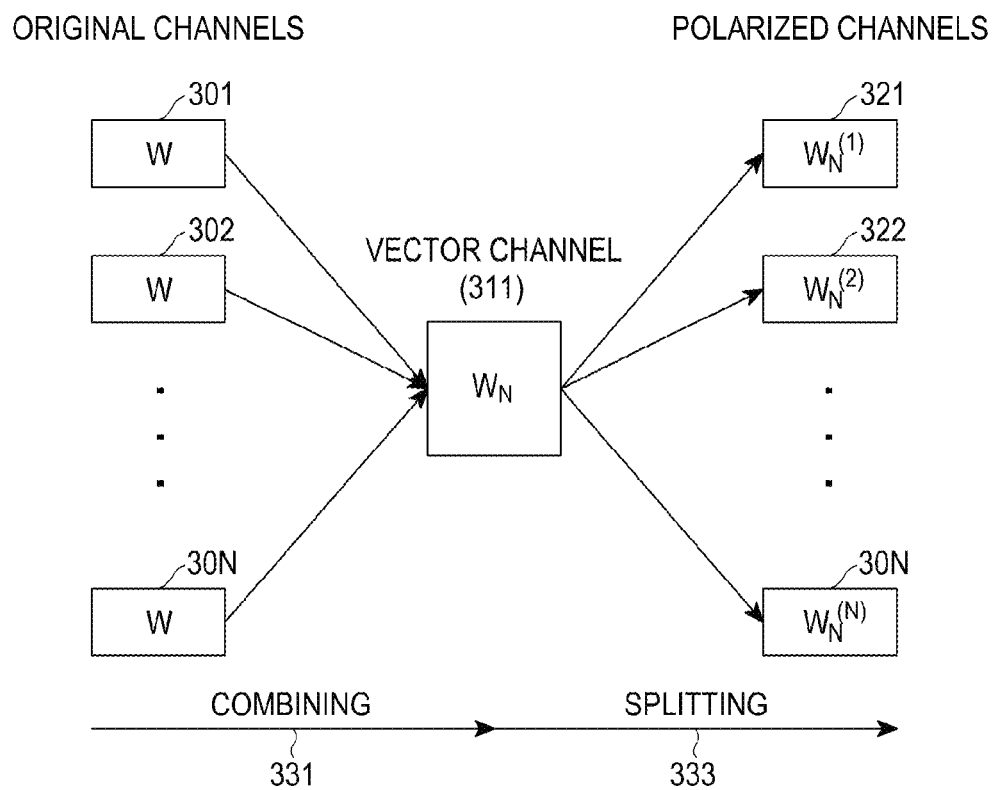
FIG. 3 is a view illustrating the concept of generating channels polarized by performing channel combining and channel splitting on N channels.

FIG. 3 is a view illustrating the concept of generating channels polarized by performing channel combining and channel division on N channels.

That is, a vector channel 311 is generated by performing channel combining (331) on N original channels 301 to 30N with the same channel capacity, and N new channel capacity-polarized channels 321 to 32N are generated by performing channel splitting (333) on the generated vector channel.

Figure 4:
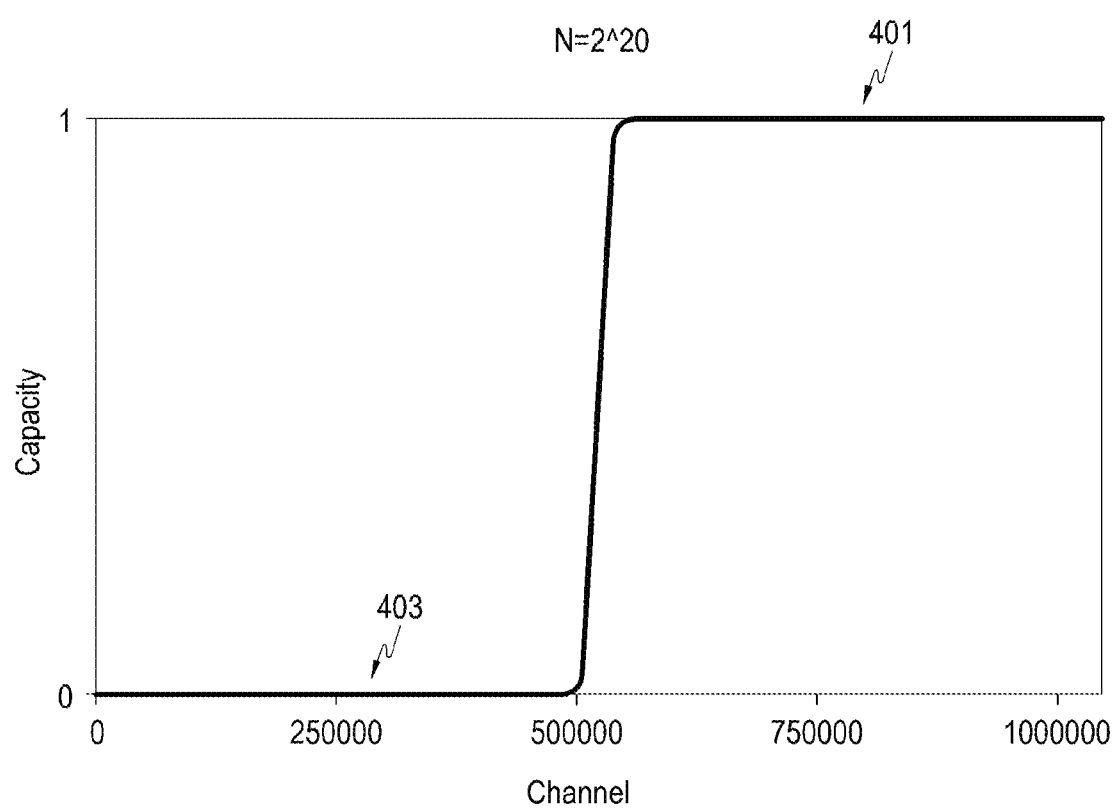
FIG. 4 is a view illustrating a result of having sorted bits channel capacities in order of size when channel polarization is repeated 20 times to extend the polar bit length to $2^{20}$.

FIG. 4 is a view illustrating a result of having sorted bits channel capacities in order of size when channel polarization is repeated 20 times to extend the polar bit length to $2^{20}$.

Referring to FIG. 4, all of $2^{20}$ original channels have a channel capacity of 0.5, but as a result of channel polarization, the channel capacity of about a half of the $2^{20}$ channels approaches nearly 1 (401) while the channel capacity of the remaining half approaches nearly 0 (403). That is, as the capacity of the channels concentrates on a half of all the channels, the channels are polarized.

Polar codes are codes generated by performing channel combining and channel splitting as set forth above to polarize channels. In FIG. 1, the input message vector $u=(u_1, u_2)$ and the codeword $x=(x_1, x_2)$ may be represented as in Equation 6.

$$x = uF \quad \text{[Equation 6]}$$

where, matrix F is the 2×2 Hadamard Matrix $$\begin{bmatrix} 1 & 0 \\ 1 & 1 \end{bmatrix}.$$

In performing the polarization process, this process is repeated to increase the bit length. Meanwhile, upon increasing the bit length by repeating the polarization process, the relationship between x and u may be represented with matrix F as shown in Equation 7.

$$\begin{cases} G_4 = F^{\otimes 2} = \begin{pmatrix} 1 & 0 & 0 & 0 \\ 1 & 1 & 0 & 0 \\ 1 & 0 & 1 & 0 \\ 1 & 1 & 1 & 1 \end{pmatrix} N = 4 = 2^2 \\ G_8 = F^{\otimes 3}, \ N = 2^3 \\ \vdots \qquad \vdots \\ G_N = F^{\otimes n}, \ N = 2^n \end{cases} \quad \text{[Equation 7]}$$

The ⊗ operation represents the Kronecker Product of matrices, which is shown in Equation 8.

$$A \otimes B = \begin{bmatrix} a_{1,1}B & a_{1,2}B & \cdots & a_{1,m}B \\ a_{2,1}B & a_{2,2}B & \cdots & a_{2,m}B \\ \vdots & \vdots & \ddots & \vdots \\ a_{n,1}B & a_{n,2}B & \cdots & a_{n,m}B \end{bmatrix} \quad \text{[Equation 8]}$$

A is the n×m matrix, and a(i,j) denotes the element positioned in the ith row and the jth column in matrix A. For convenience, it is represented as $\otimes A = A^{\otimes 2}$.

A generator matrix of polar codes with a bit length of N may be configured using matrix $G_N$ thus generated. Information bits are transmitted via use of channels whose channel capacity is close to 1 (this is called a "complete channel") among the N channels generated through $G_N$, and dummy values called "frozen bits" are set for channels whose channel capacity is close to 0 (this is called "pure noise channels"). Thereafter, the generator matrix $G_N$ is applied to generate codewords to be sent to the receiver. For reference, the frozen bit plays a similar role to the parity bit of a typical channel code, and the position and value of the frozen bit may be previously agreed and known to the transmitter and receiver.

Now described is a common decoding scheme using polar codes generated as set forth above.

When the length of all the bits is $N=2^n$, if N polarized binary input channels are generated via channel combining and channel splitting as described above, the transmitter sends information bits or frozen bits through the polarized channels. Referring back to Equation 5 here, the ith channel includes outputs $(y_1, \ldots, y_N)$ of (physical) channels and the results $(u_1, \ldots, u_{(i-1)})$ of decoding previous bits. Accordingly, upon calculating the probability value $(W_N^{(i)}(y_1^N, u_1^{i-1}|u_i))$, transition probability of channel)) to decode the ith bit, the values of the first bit through the (i–1)th bit are required. Thus, the decoding of polar codes sequentially proceeds from the first bit. Such decoding scheme is referred to as "successive cancellation (SC)." A specific SC decoding scheme is as follows.

That is, where the ith bit $(u_i)$ is decoded, (1) Where the ith bit is a frozen bit, the ith bit is determined as a previously-agreed value (0 or 1).

(2) Where the ith bit is an information bit, it is determined by Equation 9.

$$\hat{u}_1 = \begin{cases} 0, & \text{if } \dfrac{W_N^{(i)}(y_1^N, \hat{u}_1^{i-1}|u_i=0)}{W_N^{(i)}(y_1^N, \hat{u}_1^{i-1}|u_i=1)} > 1 \\ 1, & \text{otherwise} \end{cases} \quad \text{[Equation 9]}$$

Meanwhile, where SC decoding is conducted using a log likelihood ratio (LLR), the process of obtaining the probability value of channel is achieved only with an adder and a comparator, and due to its small amount of computation, the computation complexity and power consumption of decoder may be reduced. However, since SC decoding is a serial decoding scheme that sequentially performs decoding from the first bit as set forth above, the decoding of each bit cannot be performed in parallel. Thus, upon decoding, the latency may be long. Further, since hard decision is conducted per bit, if a decoding error occurs in the bit position in the middle of the bits, the performance deterioration in a limited length may worsen due to error propagation as compared with use of turbo codes and LDPCs.

f operation and g operation which are operation functions to calculate the LLR value of the bit using polar codes are described below.

In the SC decoding process described above, the process of calculating the LLR value per bit is as follows.

Referring back to FIG. 1, the LLR value for $(x_1, x_2)$ using $(y_1, y_2)$ is determined as shown in Equation 10 below.

$$L_{x_1} = \log\frac{W(y_1|x_1=0)}{W(y_1|x_1=1)}, \ L_{x_2} = \log\frac{W(y_2|x_2=0)}{W(y_2|x_2=1)} \quad \text{[Equation 10]}$$

Meanwhile, the LLR value for $(u_1, u_2)$ bit using $W^-$, $W^+$ may be represented as in Equation 11 below.

$$L_{u_1} = \log\frac{W^-(y_1, y_2|u_1=0)}{W^-(y_1, y_2|u_1=1)} =$$

$$\log\frac{W(y_1|0)W(y_2|0) + W(y_1|1)W(y_2|1)}{W(y_1|1)W(y_2|0) + W(y_1|0)W(y_2|1)} =$$

$$2\tanh^{-1}\left(\tanh\left(\frac{L_{x_1}}{2}\right)\tanh\left(\frac{L_{x_2}}{2}\right)\right) \approx$$

$$\text{sgn}(L_{x_1})\text{sgn}(L_{x_2})\min\{|L_{x_1}|, |L_{x_2}|\} \equiv f(L_{x_1}, L_{x_2})$$

$$L_2 = \log\frac{W^+(y_1, y_2, \hat{u}_1|u_2=0)}{W^+(y_1, y_2, \hat{u}_1|u_2=1)} =$$

$$\log\frac{W(y_1|\hat{u}_1)W(y_2|0)}{W(y_1|\hat{u}_1 \oplus 1)W(y_2|1)} =$$

$$(-1)^{\hat{u}_1} \cdot L_{x_1} + L_{x_2} \equiv g(L_{x_1}, L_{x_2}, \hat{u}_1)$$

[Equation 11]

f denotes the equation defined to calculate the LLR for $u_1$, and g denotes the equation defined to calculate the LLR for $u_2$.

Referring to Equation 11, the LLR value of $u_1$ is the function of channel LLR value ($L_{x1}$, $L_{x2}$). In contrast, the LLR value of $u_2$ is the function of the decoding value of $u_1$ besides the LLR value of channel. Accordingly, the decoding for $u_1$ and $u_2$ cannot be performed in parallel but should be performed serially. Meanwhile, even upon decoding polar codes with a length of $N=2^n$, the decoding values of the 1st to (i−1)th bits, as well as the LLR values ($L_{x1}, \ldots, L_{xN}$) of the channel are required to calculate the LLR value of the ith bit, so that the overall latency has a minimum O(N) value.

As set forth above, since decoding bits should be performed serially upon doing so using existing polar codes, the latency is long. Thus, according to the present disclosure, there is proposed a scheme for decoding bits in parallel using polar codes.

Hereinafter, a parallel decoding scheme using polar codes proposed herein is described in detail.

In this disclosure, there is proposed a scheme able to independently calculate the LLR value ($L_{u2}$) for $u_2$ regardless of the results of decoding $u_1$. Specifically, the LLR value of $u_2$ is represented as in Equation 12.

$$L_2 = (-1)^{\hat{u}_1} \cdot L_{x_1} + L_{x_2} = \quad \text{[Equation 12]}$$

$$\begin{cases} \text{sgn}(L_{x_1}) \cdot (|L_{x_1}| + |L_{x_2}|) \\ \quad \text{where } u_1 \text{ is information bit} \\ \text{sgn}(L_{x_1} + L_{x_2}) \cdot |L_{x_1} + L_{x_2}| \\ \quad \text{where } u_1 \text{ is frozen bit and is 0} \\ \text{sgn}(-L_{x_1} + L_{x_2}) \cdot |-L_{x_1} + L_{x_2}| \\ \quad \text{where } u_1 \text{ is frozen bit and is 1} \end{cases} \equiv g'(L_{x_1}, L_{x_2})$$

As described above, since the frozen bit has a value previously agreed between the transmitter and receiver before data is sent, the frozen bit may be either "0" or "1." Accordingly, upon implementing the g' function in the decoder as per the corresponding frozen bit value, the frozen bit may be determined using one of the second equation (when u1 is the frozen bit whose value is 0) or the third equation (when u1 is the frozen bit whose value is 1) of Equation 12. For reference, polar codes do not make a difference in performance depending on the value of the frozen bit. Generally, an all-zero vector is used as the frozen bit. In this case, g' which is the function to calculate the LLR for $u_2$ may be represented as in Equation 13.

$$L_2 = (-1)^{\hat{u}_1} \cdot L_{x_1} + L_{x_2} = \quad \text{[Equation 13]}$$

$$\begin{cases} \text{sgn}(L_{x_2}) \cdot (|L_{x_1}| + |L_{x_2}|) \\ \quad \text{where } u_1 \text{ is information bit} \\ \text{sgn}(L_{x_1} + L_{x_2}) \cdot |L_{x_1} + L_{x_2}| \\ \quad \text{where } u_1 \text{ is frozen bit} \end{cases} \equiv g'(L_{x_1}, L_{x_2})$$

$$L_2 = (-1)^{\hat{u}_1} \cdot L_{x_1} + L_{x_2} =$$

$$\begin{cases} \text{sgn}(L_{x_2}) \cdot (|L_{x_1}| + |L_{x_2}|) \\ \quad \text{where } u_1 \text{ is information bit} \\ \text{sgn}(L_{x_1} + L_{x_2}) \cdot |L_{x_1} + L_{x_2}| \\ \quad \text{where } u_1 \text{ is frozen bit} \end{cases} \equiv g'(L_{x_1}, L_{x_2})$$

Meanwhile, the result that the decoding values obtained by function g used in existing decoding schemes and by function g' used in decoding schemes as proposed herein are the same may be described as follows.

First, for the aspect that functions g and g' producing the same result where u1 is the frozen bit, it can be known to give the same result by substituting 0 or 1 for u1 in Equations 11 and 13.

Meanwhile, where u1 is the information bit, the result of the decoding of $u_i$ would be determined by function f. The number of cases that may be considered at this time is two in total; i.e., (1) the case where $L_{x1}$ and $L_{x2}$ are the same sign, and (2) $L_{x1}$ and $L_{x2}$ have different signs. For reference, where $L_{x1}$ and $L_{x2}$ both are 0, the following description would be valid whichever case it belongs to. Each case is described below.

(1) Where $L_{x1}$ and $L_{x2}$ have the same sign

Where the two LLR values of the channel have the same sign, the LLR value of $u_1$ becomes a positive value by function f. Accordingly, the decoded value of $u_1$ becomes 0. In this case, the LLR of $u_2$ is calculated as ($L_{x1}+L_{x2}$) because $u_1$ is 0, which has the same sign as the LLR value of x2.

(2) Where $L_{x1}$ and $L_{x2}$ have different signs

Where the two LLR values of the channel have different signs, the LLR value of $u_1$ becomes a negative value by function f. Accordingly, the decoded value of $u_1$ becomes 1. The LLR of $u_2$ is calculated as ($-L_{x1}+L_{x2}$) because $u_1$ is 1. Since $L_{x1}$ differs in sign from $L_{x2}$ here, $-L_{x1}$ is the same in sign as $L_{x2}$. Accordingly, in this case also, the sign of the LLR value of 112 becomes the same as the sign of the LLR value of x2.

As set forth above, functions g and g' are functions that present the same outcome.

Meanwhile, it may be thought as if conversion of function g into function g' would not have a great influence on actual decoding. However, a significant difference is made in that function g is a function for the $u_1$ value but g' is not a function for the $u_1$ value. That is, g' being not a function for $u_1$ means that the decoding of $u_1$ and $u_2$ may be performed in parallel. Accordingly, in contrast to existing decoding schemes using function g, which is serial decoding in which $u_1$ is first decoded, followed by decoding $u_2$ using the results of the decoding of $u_1$, the present disclosure performs decoding using g' and thus adopts a parallel decoding scheme that may simultaneously decode $u_1$ and $u_2$, thereby reducing decoding latency.

What has been described above is explained with reference to the structure of functions f and g' according to FIGS. 5 to 7.

Figure 5:
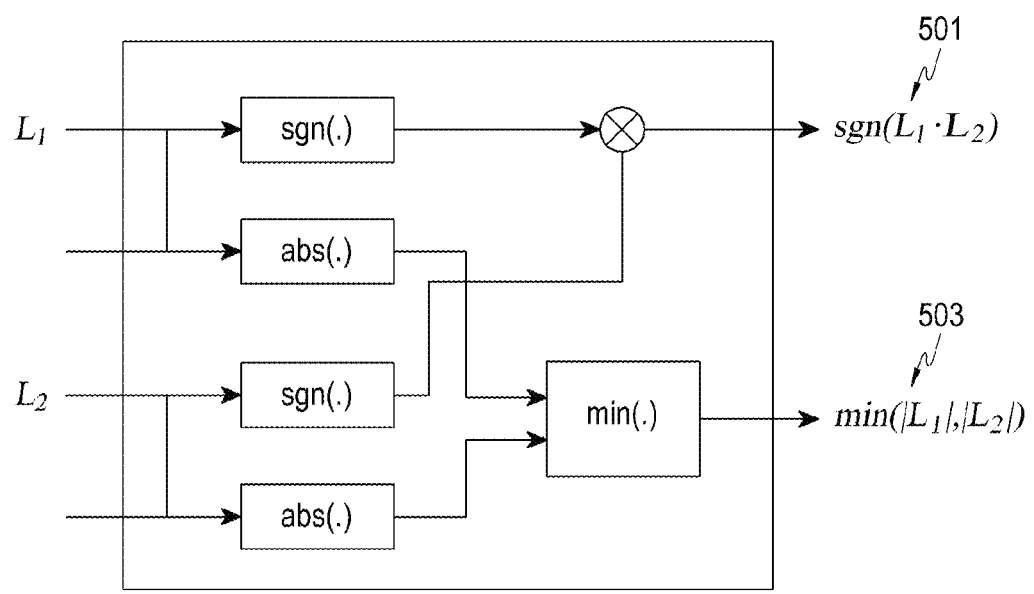
FIG. 5 is a view illustrating a logical implementation of a general form of function f used upon decoding polar codes according to an embodiment of the present disclosure.

FIG. 5 is a view illustrating a logical implementation of a general form of function f used upon decoding polar codes according to an embodiment of the present disclosure. FIG. 5 shows an implementation off included in the first equation L1 of Equation 11. It may be seen to include the components 521 and 523 of Equation 11. However, this is the same as function f which is used upon decoding using existing polar codes.

Figure 6:
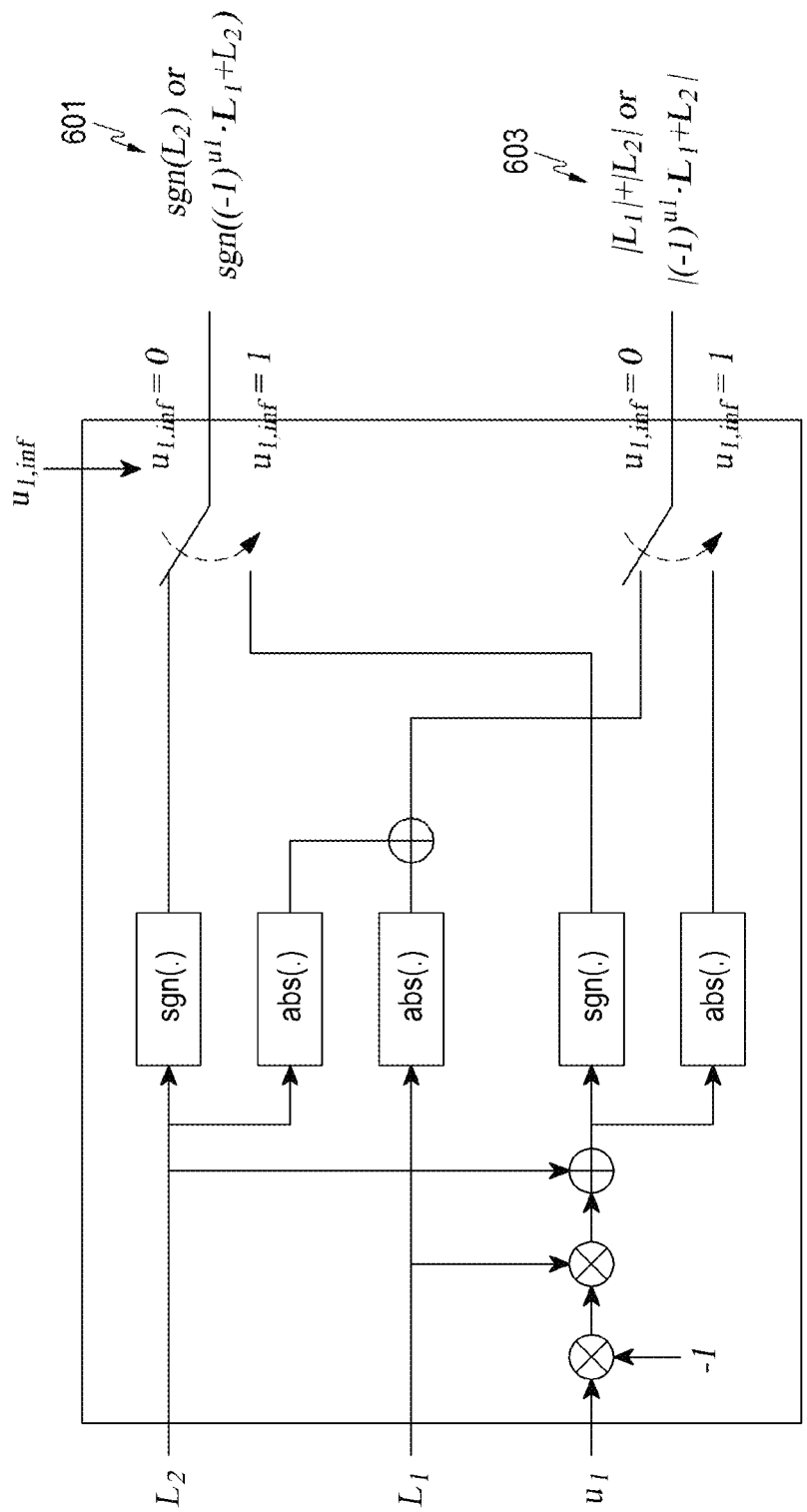
FIG. 6 is a view illustrating a logical implementation of a general form of function g' represented by Equation 12 used upon decoding polar codes according to an embodiment of the present disclosure.

FIG. 6 is a view illustrating a logical implementation of a general form of function g' represented by Equation 12 used upon decoding polar codes according to an embodiment of the present disclosure. Referring to FIG. 6, since FIG. 6 shows an implementation of Equation 12, it may be shown to include the components 621 and 623 of Equation 12.

Referring to FIG. 6, the LLR value of the input bit in function g' is determined by the LLR value of the input bit in the layer right before the current layer if the first input of the current layer is the information bit and by the value of the frozen bit and the LLR value of the input bit in the right prior layer if the first input of the current layer is the frozen bit.

Figure 7:
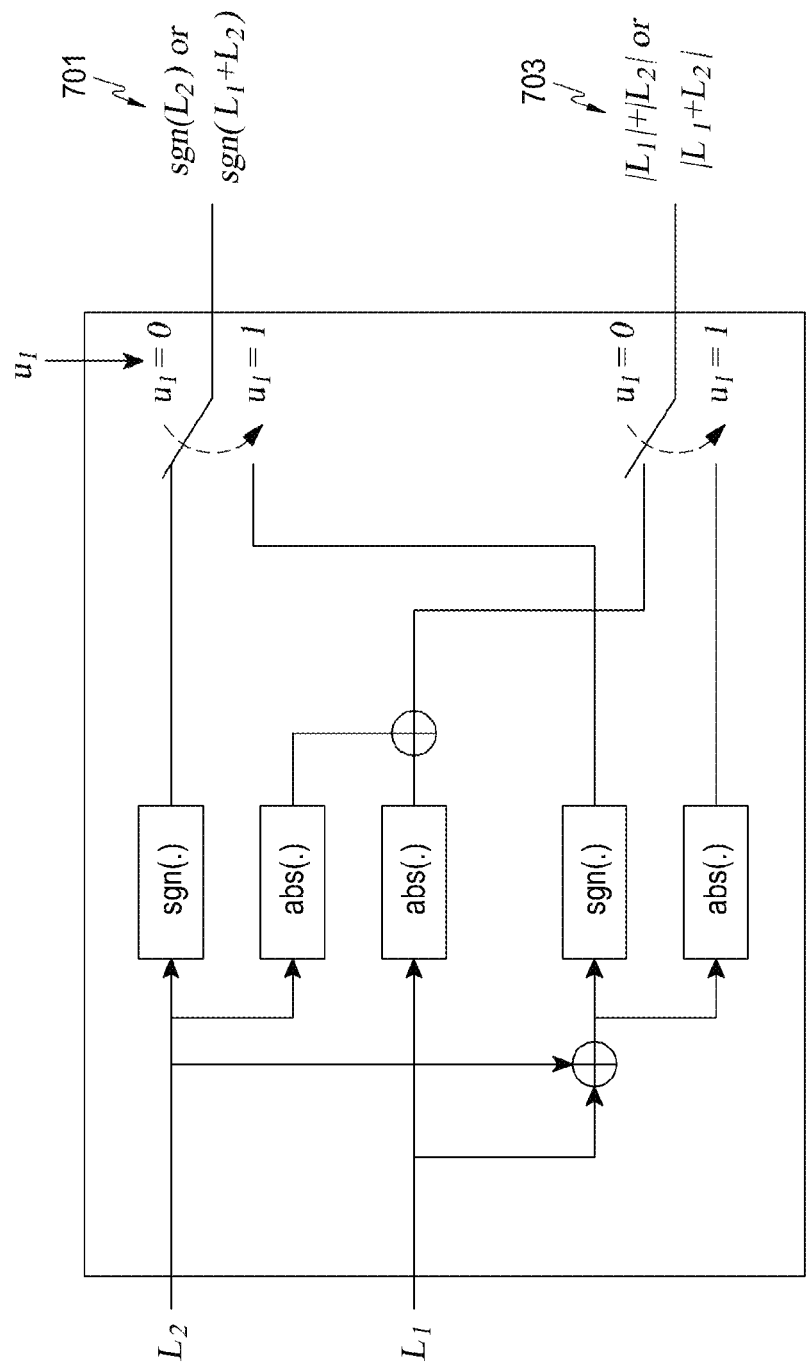
FIG. 7 is a view illustrating a logical implementation of a form when a frozen bit is 0 in function g' used upon decoding polar codes according to an embodiment of the present disclosure.

Meanwhile, FIG. 7 is a view illustrating a logical implementation of a form when a frozen bit is 0 in function g' used upon decoding polar codes according to an embodiment of the present disclosure. It is the same configuration as that shown in FIG. 6 except that the frozen bit is 0.

Meanwhile, where the LLR value of the current bit is calculated using functions f and g' by the structures of FIGS. 5 and 6, the LLR value of the current bit may be known to be influenced by only the LLR value of the previous bit. Such computation scheme may be expanded to the case where N=4 as shown in FIG. 8.

Figure 8:
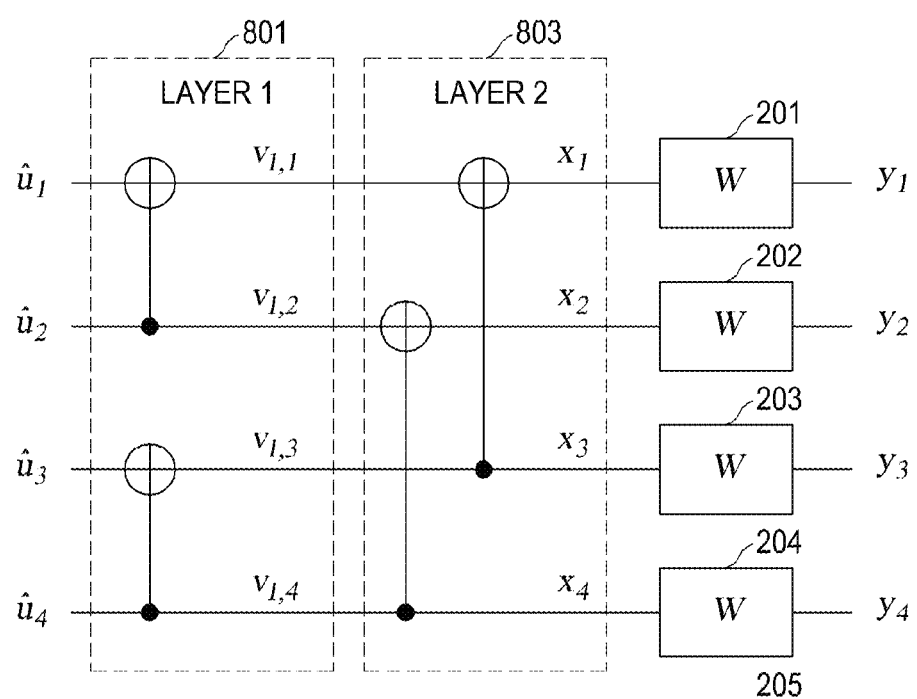
FIG. 8 is a view illustrating a decoding scheme where N=4 according to an embodiment of the present disclosure.

FIG. 8 is a view illustrating a decoding scheme where N=4 according to an embodiment of the present disclosure.

Functions f and g' are functions that convert two-bit input channels into input bit LLR values using the channel LLR values. Where the length is 4, the structure may be shown to consist of two layers. In this disclosure, such a single structure would be denoted a layer. FIG. 8 illustrates a layer 1 801 and a layer 2 803. Since the order of the layers is for distinguishing between the layers, the order may begin from either the right or left. However, decoding in FIG. 8 proceeds in the order of yi=>xi=>ui. Meanwhile, the LLR value of the output bit of one layer by the layers distinguished as such may be used as the LLR value of the input bit of the next layer.

In FIG. 8, in the first step related to layer 2 803, the LLR values for $x_1$ to $x_4$ are used to calculate the LLRs for $v_{(1,1)}$ to $v_{(1,4)}$. In the second step related to layer 1 801, the LLR values of $v_{(1,1)}$ to $v_{(1,4)}$ calculated in the first step are used to calculate the LLRs for $u_1$ to $u_4$. For polar codes whose length is $N=2^n$, there would exist n layers in total. Therefore, where decoding is performed by the scheme proposed herein, the decoding operation may be complete via n steps.

The decoding scheme proposed and described according to the present disclosure is summarized as follows.

Of functions f and g used in decoding schemes using existing polar codes, g may be conducted after the LLR value of u1 is determined according to the result of f operation, it presents a great latency. In this disclosure, function g is converted into function g' which is irrelevant to u1, and accordingly, f and g' may concurrently be operated in parallel. Thus, for polar codes where N=2, the decoding operation may be complete within a computation time of 1 in total. This may be generalized as follows: for polar codes where $N=2^n$, there are n layers in total, and since a computation time of 1 is needed per layer, the computation time necessary for the overall decoding would be n.

Now described is a process for decoding polar codes using functions f and g', according to an embodiment of the present disclosure, under the assumption that the length of the polar codes is 8.

Hereinafter, the first decoding scheme as per this disclosure is to achieve a minimum latency, which is described with reference to FIG. 9 and Table 1.

Figure 9:
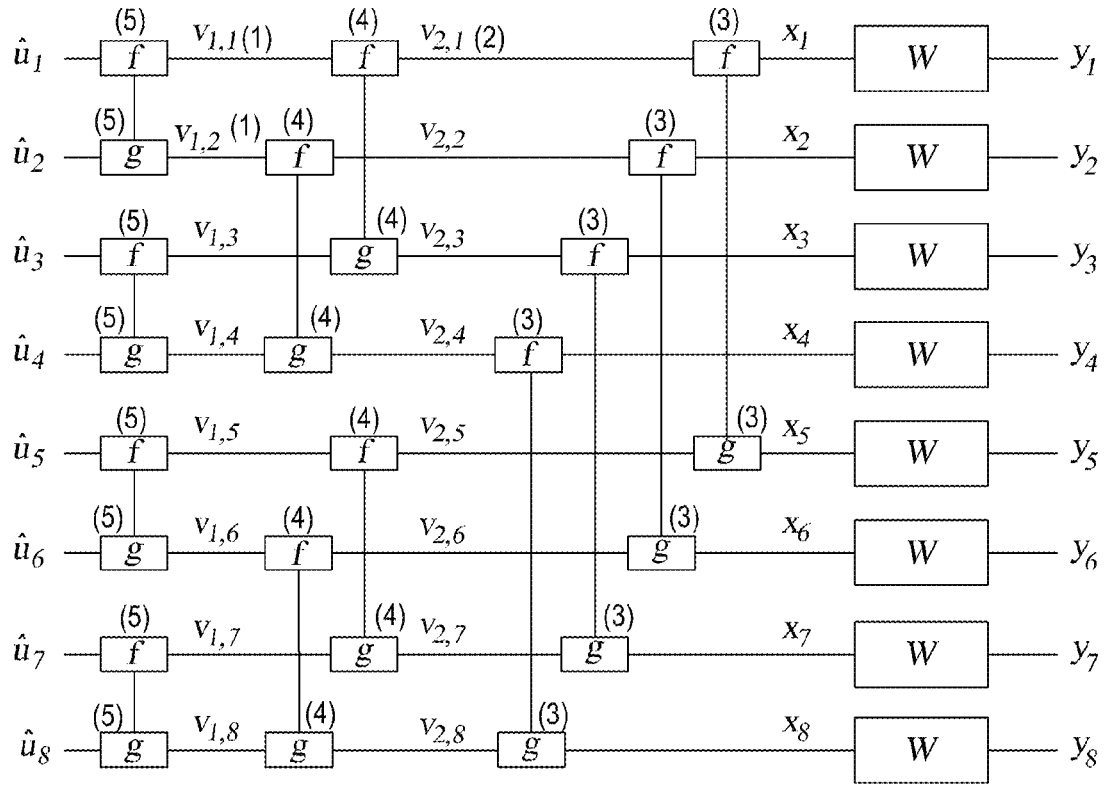
FIG. 9 is a view illustrating a process of decoding polar codes with a length of 8 using functions f and g' per decoding time according to an embodiment of the present disclosure.

FIG. 9 is a view illustrating a process of decoding polar codes with a length of 8 using functions f and g' per decoding time according to an embodiment of the present disclosure.

Table 1 below represents per-time resultant values for the decoding operation of the first scheme of the present disclosure under the assumption that the position of the frozen bit is $u_i$=(1,2,3,5) and the value of the frozen bit is 0 in the polar codes as shown in FIG. 9.

TABLE 1

| Bit Index | t = 0 (Initial State) | | | | t = 1 (FB Initialization) | | | | t = 2 (Layer 3 Update) | | | |
|---|---|---|---|---|---|---|---|---|---|---|---|---|
| | u | v1 | v2 | x | u | v1 | v2 | x | u | v1 | v2 | x |
| 1 | 0 | | | L_1 | 0 | 0 | | L_1 | 0 | 0 | −L_1 | L_1 |
| 2 | 0 | | | −L_2 | 0 | 0 | | −L_2 | 0 | 0 | L_2 | −L_2 |
| 3 | 0 | | | L_3 | 0 | | | L_3 | 0 | | L_3 | L_3 |
| 4 | | | | L_4 | | | | L_4 | | | L_4 | L_4 |
| 5 | 0 | | | −L_5 | 0 | | | −L_5 | 0 | | −(L_1 + L_5) | −L_5 |
| 6 | | | | −L_6 | | | | −L_6 | | | −(L_2 + L_6) | −L_6 |
| 7 | | | | L_7 | | | | L_7 | | | (L_3 + L_7) | L_7 |
| 8 | | | | L_8 | | | | L_8 | | | (L_4 + L_8) | L_8 |

| Bit Index | t = 3 (Layer 2 Update) | | | | t = 4 (Layer 1 Update) | | | |
|---|---|---|---|---|---|---|---|---|
| | u | v1 | v2 | x | u | v1 | v2 | x |
| 1 | 0 | 0 | −L_1 | L_1 | 0 | 0 | −L_1 | L_1 |
| 2 | 0 | 0 | L_2 | L_2 | 0 | 0 | L_2 | −L_2 |
| 3 | 0 | (−L_1 + L_3) | L_3 | L_3 | 0 | (−L_2 + L_3) | L_3 | L_3 |
| 4 | | (L_2 + L_4) | L_4 | L_4 | (−L_1 + L_2 + L_3 + L_4) | (L_2 + L_4) | L_4 | L_4 |
| 5 | 0 | −(L_1 + L_5) | −(L_1 + L_5) | −L_5 | 0 | −(L_1 + L_5) | −(L_1 + L_5) | −L_5 |
| 6 | | −(L_2 + L_6) | −(L_2 + L_6) | −L_6 | −(L_1 + L_2 + L_5 + L_6) | −(L_2 + L_6) | −(L_2 + L_6) | −L_6 |
| 7 | | (L_1 + L_3 + L_5 + L_7) | (L_3 + L_7) | L_7 | (L_1 + L_3 + L_5 + L_7) | (L_1 + L_3 + L_5 + L_7) | (L_3 + L_7) | L_7 |
| 8 | | (L_2 + L_4 + L_6 + L_8) | (L_4 + L_8) | L_8 | (L_1 + ... + L_8) | (L_2 + L_4 + L_6 + L_8) | (L_4 + L_8) | L_8 |

(1) t=0

In Table 1, the area where t=0 is marked 'initial state.'

Accordingly, the values of the frozen bits $u_1$, $u_2$, $u_3$, and $u_5$ are all denoted "0s." Meanwhile, the LLR value of each input channel (xi) is assumed to be arbitrarily (L1, −L2, L3, L4, −L5, −L6, L7, L8). The following assumption is also made: 0<L1< . . . <L8.

(2) t=1

At t=1 in Table 1, "frozen bit initialization" is performed.

Figure 10:
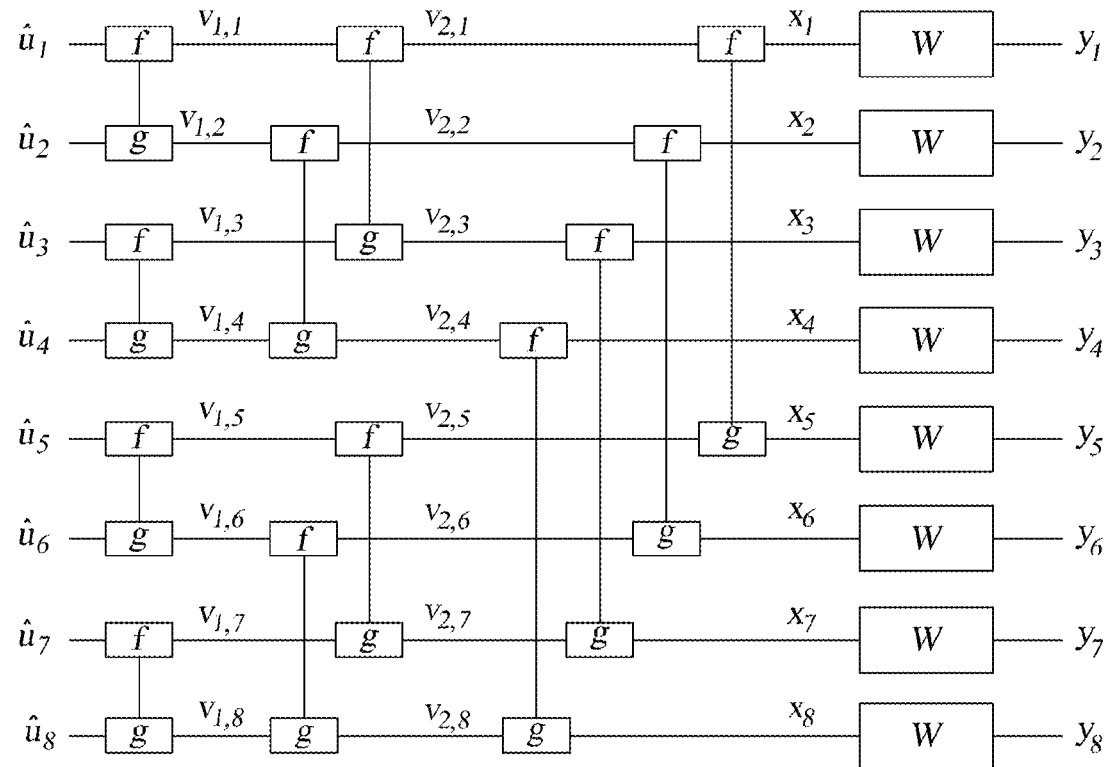
FIG. 10 is a view illustrating a process of decoding polar codes with a length of 8 using functions f and g' per decoding time according to a modified embodiment of the present disclosure.

At t=1, the $v_{(1,i)}$(i=1~8) value of FIG. 9 should be determined. Meanwhile, the area where t=1 in FIG. 10 is marked "FB initialization." Frozen bit initialization as defined in this disclosure is as follows. Referring back to Equation 12, while function g' is defined, the LLR value is calculated in different equations depending on whether the $u_1$ bit is the information bit or frozen bit. Accordingly, before starting the decoding operation, it is determined which one of the decoder's internal bits ($v_{(1,i)}$, $v_{(2,i)}$, i=1, . . . , 8) is the frozen bit using the position and value of the frozen bit of the input message. Such process would be called "frozen bit (FB) initialization."

The frozen bit initialization process is performed at t=1. The reason why frozen bit initialization is performed is that the frozen bit is a value already known and no decoding is required in the position of the frozen bit. As such, since no operation for decoding is required in the position of the frozen bit, the frozen bit is sought before the overall decoding operation.

Details of frozen bit initialization are as follows.

As set forth above in connection with FIG. 2, it can be known that $u_i$ and $u_{(i+1)}$ are used to generate the $v_{(1,i)}$ and $v_{(1,i+1)}$ values. Here, i=1, 3, 5, 7. Meanwhile, since $u_1$ and $u_2$ both are frozen bits, $v_{(1,1)}$ and $v_{(1,2)}$ are determined by the $u_1$ and $u_2$ values. Thus, the internal bits $v_{(1,1)}$ and $v_{(1,2)}$ are frozen bits, and the values of the corresponding frozen bits are stored in the storage unit of the decoder. To represent such computational process in FIG. 9, $v_{(1,1)}$ and $v_{(1,2)}$ are denoted with reference number (1), and $v_{(2,1)}$ is denoted with reference number (2).

Meanwhile, since, for $v_{(1,3)}$ and $v_{(1,4)}$, $u_3$ is a frozen bit, but $u_4$ is an information bit, the $v_{(1,3)}$ and $v_{(1,4)}$ values may be varied by the $u_4$ value. That is, since the $v_{(1,3)}$ and $v_{(1,4)}$ bits become information bits, and their values are not known yet, no corresponding values may be determined in the current stage. Likewise, since the values of v(1,5) to v(1,8) are not determined by the frozen bits, all of them serve as information bits. Thus, when t=1, the values of only $v_{(1,1)}$ and $v_{(1,2)}$ are determined.

As set forth above, the frozen bits of the internal bits have been initialized by the frozen bits $u_i$=(1, 2, 3, 5)=0 previously agreed. That is, internal frozen bits which may be determined by input frozen bits may all be determined. Once the frozen bits are determined so, the decoding operation performed per layer is described below.

(2) t=2

At t=1 in Table 1, "layer 3 update" is performed. That is, this is a step in which the functional operations denoted with (3) in FIG. 9 using the LLR values of xi of layer 3 are simultaneously performed so that $v_{(2,i)}$, which are values of layer 2, are computed in parallel. Accordingly, at t=2, the values of $v_{(2,i)}$(i=1~8) of FIG. 9 are determined. Based on this, the value of $v_{(2,i)}$ is calculated. Meanwhile, the frozen bits $v_{(1,1)}$ and $v_{(1,2)}$ are used to generate the values of v(2,i)(i=1,2,3,4) while all connected with other information bits. Accordingly, all the v(2,i) bits become information bits. The following is a specific example of calculating the value of $v_{(2,i)}$ using the LLR value of xi.

Referring to FIG. 9, it can be known that upon performing the f and g' operations on xi of layer 3, the LLR values of v(2,i) and v(2,i+4) are generated as a combination of the LLR values of xi and x(i+4)(i=1, 2, 3, 4). Thus, the f and g' operations in layer 3 are simultaneously performed so that the LLR values up to v(2,1) to v(2,8) are calculated as (−L1, L2, L3, L4, −(L1+L5), −(L2+L6), (L3+L7), and (L4+L8)). Such resultant values are set forth in Table 1.

(3) t=3

At t=3 in Table 1, "layer 2 update" is performed. That is, this is a step in which the functional operations denoted with (4) in FIG. 9 using the LLR values of $v_{(2,i)}$ of layer 2 are simultaneously performed so that $v_{(1,i)}$, which are values of layer 1, are computed in parallel.

Meanwhile, as set forth above, the values of $v_{(1,1)}$ and $v_{(1,2)}$ have already been determined as "0s" in the frozen bit initialization step. At t=3, upon calculating the LLR of v(1,3), the frozen bit $v_{(1,1)}$ is used. Accordingly, the frozen bit is updated by performing computation on the frozen bit upon the g' operation. Since the frozen bit $v_{(1,2)}$ is used also upon the computation of v(1,4), the frozen bit is updated in the same manner as the operation process of the LLR value of v(1,3).

Conversely, since v(1,5) to v(1,8) are all information bits, the LLR values may be updated by the computation on the information bits of the f function and the g' function. Resultantly, the LLR values of $v_{(1,i)}$ become (0, 0, (−L1+L3), (L2+L4), −(L1+L5), −(L2+L6), (L1+L3+L5+L7), and (L2+L4+L6+L8)). This is set forth in Table 1.

(4) t=4

At t=4 in Table 1, "layer 1 update" is performed. That is, this is a step in which the functional operations denoted with (5) in FIG. 9 using the LLR values of $v_{(1,i)}$ of layer 1 are simultaneously performed so that $u_i$ is computed in parallel. At t=4, the LLR value computation for $u_4$, $u_6$, $u_7$, and $u_8$ may be performed using functions f and g'. At this time, the LLR values finally obtained become (0, 0, 0, (−L1+L2+L3+L4), 0, −(L1+L2+L5+L6), (L1+L3+L5+L7), and (L1+L2+L3+L4+L5+L6+L7+L8)). Here, 0 means a frozen bit. Thus, the final result of decoding becomes (0,0,0,0,0,1,0,0).

The computation time of the decoding scheme proposed in this disclosure and described thus far is as follows.

First, the frozen bit initialization process proceeds through the bit computation from $u_i$ in the order of $v_{(1,i)}$ and $v_{(2,i)}$, and polar codes whose length is N=$2^n$ 인 requires the maximum (log N−1) [clock or decoding time]. Next, where the process of generating decoded outputs from the channel LLR values is performed completely in parallel, as long a time as 1 (clock or decoding time) is taken per layer. Thus, as long a time as the overall log N [clock or decoding time] is needed.

Accordingly, the decoding scheme proposed in this disclosure takes as long a decoding latency as the overall 2*log N−1 [clock or decoding time]. To achieve such computation, the LLR values of bits each determined per intermediate step should all be stored. To that end, the memory capacity of the decoder thus needs overall N*(log N−1).

Figure 11:
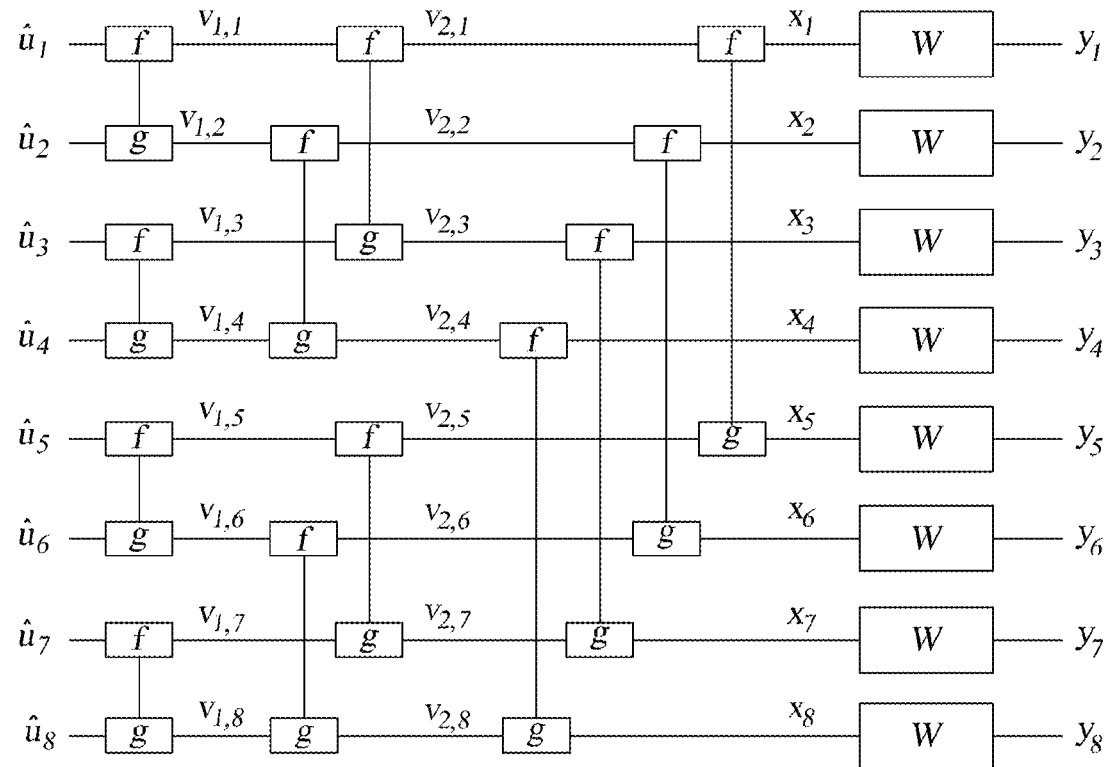
FIG. 11 is a view illustrating a result of decoding when polar codes with a length of 8 are decoded by parallel-processing two bits using functions f and g' according to an embodiment of a third scheme of the present disclosure.

Now described are variations to the above-described embodiments with reference to FIG. 10 or 11.

The embodiment described in connection with FIG. 9 is an embodiment in which the minimum latency has been set. However, since in the embodiment of FIG. 9 the LLR value should be calculated and stored per layer, the memory capacity in the decoder increases. However, where it is hard to increase the memory capacity depending on applications, the reduction in the memory capacity may be achieved by decreasing the number of parallel processes in the embodiment of FIG. 9.

FIG. 10 is a view illustrating a process of decoding polar codes with a length of 8 using functions f and g' per decoding time according to a modified embodiment of the present disclosure.

Meanwhile, Table 2 below represents per-decoding time resultant values by the decoding process of FIG. 10.

to indicate that they have not been processed in parallel. It can also be seen that, for the remaining times, the LLR values for the four bits have been determined.

Meanwhile, when N=8, possible M values may be 8, 4, 2, and 1. The case where M=8 has been described above in connection with FIG. 9 and is related to the embodiment

| Bit Index | t = 0 (Initial) | | | | t = 1 | | | | t = 2 | | | | t = 3 | | | | t = 4 | | | |
|---|---|---|---|---|---|---|---|---|---|---|---|---|---|---|---|---|---|---|---|---|
| | u | v1 | v2 | x | u | v1 | v2 | x | u | v1 | v2 | x | u | v1 | v2 | x | u | v1 | v2 | x |
| 1 | 0 | | | | | L_1 | | 0 | 0 | L_v21 | L_1 | 0 | 0 | | L_v21 | L_1 | 0 | 0 | | L_v21 |
| 2 | 0 | | | | | −L_2 | | 0 | 0 | L_v22 | −L_2 | 0 | 0 | | L_v22 | −L_2 | 0 | 0 | | L_v22 |
| 3 | 0 | | | | | L_3 | | 0 | | L_v23 | L_3 | 0 | | L_v13 | L_v23 | L_3 | 0 | L_v13 | | L_v23 |
| 4 | 0 | | | | | L_4 | | | | L_v24 | L_4 | | | L_v14 | L_v24 | L_4 | (−L_1 + L_2 + L_3 + L_4) | L_v14 | | L_v24 |
| 5 | 0 | | | | | −L_5 | | 0 | | | −L_5 | 0 | | | −L_5 | | 0 | | | |
| 6 | | | | | | −L_6 | | | | | −L_6 | | | | −L_6 | | | | | |
| 7 | | | | | | L_7 | | | | | L_7 | | | | L_7 | | | | | |
| 8 | | | | | | L_8 | | | | | L_8 | | | | L_8 | | | | | |

| Bit Index | t = 4 | t = 5 | | | | t = 6 | | | | t = 7 | | | |
|---|---|---|---|---|---|---|---|---|---|---|---|---|---|
| | x | u | v1 | v2 | x | u | v1 | v2 | x | u | v1 | v2 | x |
| 1 | L_1 | 0 | | | L_1 | 0 | | | L_1 | 0 | | | L_1 |
| 2 | −L_2 | 0 | | | −L_2 | 0 | | | −L_2 | 0 | | | −L_2 |
| 3 | L_3 | 0 | | | L_3 | 0 | | | L_3 | 0 | | | L_3 |
| 4 | L_4 | (−L_1 + L_2 + L_3 + L_4) | | | L_4 | (−L_1 + L_2 + L_3 + L_4) | | | L_4 | (−L_1 + L_2 + L_3 + L_4) | | | L_4 |
| 5 | −L_5 | 0 | | L_v25 | −L_5 | 0 | L_v15 | L_v25 | −L_5 | 0 | L_v15 | L_v25 | −L_5 |
| 6 | −L_6 | | | L_v26 | −L_6 | | L_v16 | L_v26 | −L_6 | (−L_1 + L_2 + L_5 + L_6) | L_v16 | L_v26 | −L_6 |
| 7 | L_7 | | | L_v27 | L_7 | | L_v17 | L_v27 | L_7 | (−L_1 + L_3 + L_5 + L_7) | L_v17 | L_v27 | L_7 |
| 8 | L_8 | | | L_v28 | L_8 | | L_v18 | L_v28 | L_8 | (L_1 + ... + L_8) | L_v18 | L_v28 | L_8 |

The scheme shown in FIG. 10 is a scheme that adjusts the number of bits processable in parallel given a tradeoff between latency and memory capacity. FIG. 10 shows an embodiment in which the number (M) of bits processable in parallel is assumed to be 4 upon performing decoding using polar codes. As compared with the embodiment of FIG. 9, FIG. 10 shows an embodiment in which M=4 where FIG. 9 shows an embodiment in which M=8.

The embodiment of FIG. 10 is similar in basic operations to the embodiment of FIG. 9. However, it differs from the embodiment of FIG. 9 in that the number of bits processed in parallel in one layer is 4. It can be seen that, upon obtaining $v_{(2,i)}$ at t=1 in Table 2, only four LLR values have been determined while the remaining four have been shaded where the latency is minimized. The case where M=4 has been shown in FIG. 10 and Table 2, which considers both latency and memory capacity. The case where M=2 is also likely, and the case where M=2 has been shown in FIG. 11 and Table 3. Meanwhile, if M=1, this becomes an existing decoding scheme.

FIG. 11 is a view illustrating a process of decoding polar codes with a length of 8 using functions f and g' per decoding time according to a modified embodiment of the present disclosure.

Meanwhile, Table 3 below represents per-decoding time resultant values by the decoding process of FIG. 11.

TABLE 3

| Bit Index | t = 0 (Initial) | | | t = 1 | | | t = 2 | | | t = 3 | | | t = 4 | | |
|---|---|---|---|---|---|---|---|---|---|---|---|---|---|---|---|
| | u | m | x | u | m | x | u | m | x | u | m | x | u | m | x |
| 1 | 0 | | | | L_1 | 0 | | L_v21 | L_1 | 0 | | L_v21 | L_1 | 0 | L_v25 | L_1 |
| 2 | 0 | | | | −L_2 | 0 | | L_v22 | −L_2 | 0 | | L_v22 | −L_2 | 0 | L_v26 | −L_2 |
| 3 | 0 | | | | L_3 | 0 | | L_v23 | L_3 | 0 | | L_v23 | L_3 | 0 | L_v27 | L_3 |
| 4 | 0 | | | | L_4 | | | L_v24 | L_4 | (−L_1 + L_2) (L_3 + L_4) | L_v24 | L_4 | (−L_1 + L_2) (L_3 + L_4) | L_v28 | L_4 |
| 5 | 0 | | | | −L_5 | 0 | | L_v13 | −L_5 | 0 | | L_v13 | −L_5 | 0 | | −L_5 |
| 6 | | | | | −L_6 | | | L_v14 | −L_6 | | | L_v14 | −L_6 | | | −L_6 |

TABLE 3-continued

| | | | | | | | | | | | | |
|---|---|---|---|---|---|---|---|---|---|---|---|---|
| 7 | | L_7 | | | L_7 | | | L_7 | | | L_7 | |
| 8 | | L_8 | | | L_8 | | | L_8 | | | L_8 | |

| Bit | t = 5 | | | t = 6 | | | t = 7 | | | t = 8 | | |
|---|---|---|---|---|---|---|---|---|---|---|---|---|
| Index | u | m | x | u | m | x | u | m | x | u | m | x |
| 1 | 0 | L_v25 | L_1 | 0 | L_v25 | L_1 | 0 | L_v25 | L_1 | 0 | L_v25 | L_1 |
| 2 | 0 | L_v26 | −L_2 | 0 | L_v26 | −L_2 | 0 | L_v26 | −L_2 | 0 | L_v26 | −L_2 |
| 3 | 0 | L_v27 | L_3 | 0 | L_v27 | L_3 | 0 | L_v27 | L_3 | 0 | L_v27 | L_3 |
| 4 | (−L_1 + L_2)(L_3 + L_4) | L_v28 | L_4 | (−L_1 + L_2)(L_3 + L_4) | L_v28 | L_4 | (−L_1 + L_2)(L_3 + L_4) | L_v28 | L_4 | (−L_1 + L_2)(L_3 + L_4) | L_v28 | L_4 |
| 5 | 0 | L_v15 | −L_5 | 0 | L_v15 | −L_5 | 0 | L_v17 | −L_5 | 0 | L_v17 | −L_5 |
| 6 | | L_v16 | −L_6 | (−L_1 + L_2)(L_5 + L_6) | L_v16 | −L_6 | (−L_1 + L_2)(L_5 + L_6) | L_v18 | −L_6 | (−L_1 + L_2)(L_5 + L_6) | L_v18 | −L_6 |
| 7 | | | L_7 | | | L_7 | | | L_7 | (L_1 + L_3)(L_5 + L_7) | | L_7 |
| 8 | | | L_8 | | | L_8 | | | L_8 | (L_1 + L_8) | | L_8 |

In the embodiment of FIG. 11, which is similar to that of FIG. 10, M=2. In this case, upon calculating the LLR value for $u_i$, two bits are simultaneously computed during one computation time. In this case, the latency is reduced as compared with existing schemes, but the memory capacity required for computation is the same as that of SPSC decoders according to the prior art. In the embodiment of FIG. 11, the decoding latency is $1.5*N^2$. This has been reduced by about 25% as compared with the latency, $2*N^2$, of existing SPSC decoders.

An overall method and a configuration of a receiver according to the above-described embodiments are briefly described below.

Figure 12:
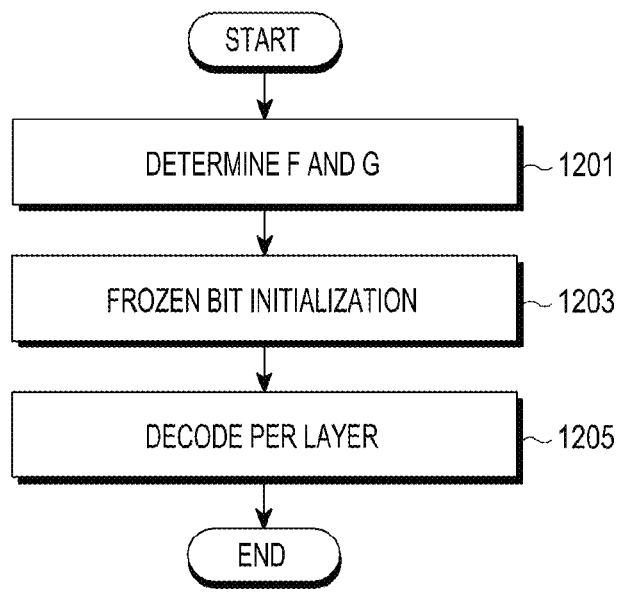
FIG. 12 is a view illustrating an overall decoding scheme according to an embodiment of the present disclosure.

FIG. 12 is a view illustrating an overall decoding scheme according to an embodiment of the present disclosure.

In step 1201, functions f and g' are determined. Functions f and g' are the same as those described above in connection with Equations 11, 12, and 13. Thereafter, decoding is performed on input bits according to the present disclosure. Specifically, frozen bit initialization is performed to determine bits corresponding to frozen bits in internal bits of the decoder in step 1203. In step 1205, decoding is performed in such a manner that the LLR values of the bits are determined in parallel and sequentially from a higher layer. Specific operation examples have been described above in connection with FIG. 9, and no further detailed description thereof are thus given.

Figure 13:
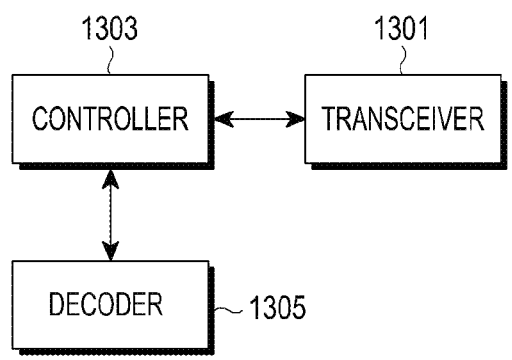
FIG. 13 is a view illustrating a configuration of a receiver according to an embodiment of the present disclosure.

FIG. 13 is a view illustrating a configuration of a receiver according to an embodiment of the present disclosure.

A receiver includes a transceiver 1301, a controller 1303, and a decoder 1305. The decoder 1305 may include a memory (not shown), or a memory (not shown) may be included outside the decoder 1305.

The transceiver 1301 receives signals from a transmitter and delivers the signals to the controller 1303. The controller 1303 may perform general controls necessary for decoding according to the present disclosure. For example, the controller 1303 may determine functions f and g', transfer the functions to the decoder 1305, or determine the number of bits decodable simultaneously (or in parallel) on bits given the memory capacity or latency and deliver the same to the decoder 1305.

The decoder 1305 decodes, in parallel, bits per layer as set forth above. This has been described above in connection with FIG. 9, and no detailed description thereof is presented.

As compared with decoding schemes using existing polar codes, a latency of $(2*\log N-1)$ may be achieved by the above-described embodiments of the present disclosure.

Further, the number of bits processable in parallel given the latency and memory capacity may be adjusted.

Particular aspects of the present disclosure may be implemented as computer readable codes in a computer readable recording medium. The computer readable recording medium is a data storage device that may store data readable by a computer system. Examples of the computer readable recording medium may include read only memories (ROMs), random access memories (RAMs), CD-ROMs, magnetic tapes, floppy disks, optical data storage devices, and carrier waves (such as data transmission over the Internet). The computer readable recording medium may be distributed by computer systems over a network, and accordingly, the computer readable codes may be stored and executed in a distributed manner. Functional programs, codes, and code segments to attain the present disclosure may be readily interpreted by skilled programmers in the art to which the present disclosure pertains.

The apparatuses and methods according to embodiments of the present disclosure may be implemented in hardware, software, or a combination of hardware and software. Such software may be stored in a volatile or non-volatile storage device such as a read-only memory (ROM) or other storage devices, a memory, such as a random access memory (RAM), a memory chip, a device or an integrated circuit, or a storage medium, such as, e.g., a compact disc (CD), a digital video disc (DVD), a magnetic disk, or a magnetic tape, which allows for optical or magnetic recording while simultaneously read out by a machine (e.g., a computer). The methods according to embodiments of the present disclosure may be implemented by a computer or a portable terminal including a controller and a memory, and the memory may be an exemplary machine-readable storage medium that may properly retain program(s) containing instructions for implementing the embodiments of the present disclosure.

Accordingly, the present disclosure encompasses a program containing codes for implementing the device or method set forth in the claims of this disclosure and a machine (e.g., computer)-readable storage medium storing the program. The program may be electronically transferred via any media such as communication signals transmitted through a wired or wireless connection and the present disclosure properly includes the equivalents thereof.

The invention claimed is:

1. A decoding method of an electronic device in a communication system, the method comprising:
    receiving a signal including codeword bits that are encoded based on one polar code; and
    decoding, in parallel, the codeword bits based on a first scheme and a second scheme to estimate information bits that correspond to the codeword bits,
    wherein, in the second scheme, a second codeword bit is decoded independently from a log likelihood ratio (LLR) value of a first codeword bit which is obtained in the first scheme,
    wherein the first codeword bit and the second codeword bit are included in the codeword bits, and the first codeword bit precedes the second codeword bit;
    generating data according to the decoded codeword bits; and
    transmitting a response signal based on the generated data in the communication system.

2. The decoding method of claim 1, wherein the decoding includes, in case that a length of the codeword bits is $2^N$, sequentially obtaining LLR values for bits included in each of N layers.

3. The decoding method of claim 2, wherein the decoding includes:
    identifying a value of an internal frozen bit based on at least one codeword frozen bit having a set value in a set position among the codeword bits, and
    obtaining the LLR values for the bits of a layer sequentially from higher layers among the N layers.

4. The decoding method of claim 3, wherein the identified value of the internal frozen bit and resultant values sequentially decoded per layer are stored in a memory.

5. The decoding method of claim 2, wherein:
    an LLR value of a first input bit in a first layer is obtained by an LLR value of a second input bit in second layer preceding the first layer in case that the first input bit is an information bit, and
    the LLR value of the first input bit in the first layer is obtained by the LLR value of the second input bit in the second layer and a value of a frozen bit in case that the first input bit is the frozen bit.

6. The decoding method of claim 1, wherein a number of the codeword bits to be decoded in parallel is identified based on a memory capacity necessary upon decoding and latency upon decoding.

7. The decoding method of claim 1, wherein:
    the first scheme is an equation below, $$L_{u_1} = \log \frac{W^-(y_1, y_2 | u_1 = 0)}{W^-(y_1, y_2 | u_1 = 1)}$$
$$= \log \frac{(W(y_1|0)W(y_2|0) + W(y_1|1)W(y_2|1))}{(W(y_1|1)W(y_2|0) + W(y_1|0)W(y_2|1))}$$
$$= 2\tanh^{-1}(\tanh(L_{x_1}/2)\tanh(L_{x_2}/2))$$
$$\approx \text{sgn}(L_{x_1})\text{sgn}(L_{x_2})\min\{|L_{x_1}|, |L_{x_2}|\} \equiv f(L_{x_1}, L_{x_2})$$

the second scheme is an equation below, $$L_{u_2} = (-1)^{\hat{u}_1} \cdot L_{x_1} + L_{x_2}$$

$$= \begin{cases} \text{sgn}(L_{x_1}) \cdot (|L_{x_1}| + |L_{x_2}|) \\ \quad \text{where } u_1 \text{ is information bit} \\ \text{sgn}(L_{x_1} + L_{x_2}) \cdot |L_{x_1} + L_{x_2}| \\ \quad \text{where } u_1 \text{ is frozen bit and is 0} \\ \text{sgn}(-L_{x_1} + L_{x_2}) \cdot |-L_{x_1} + L_{x_2}| \\ \quad \text{where } u_1 \text{ is frozen bit and is 1} \end{cases}$$
$$\equiv g'(L_{x_1}, L_{x_2})$$

$L_{u_1}$ is an LLR value of the first codeword bit of a first layer,
$L_{u_2}$ is an LLR value of the second codeword bit of the first layer,
$L_{x_1}$ is a first input value of the first layer, and
$L_{x_2}$ is a second input value of the first layer.

8. An electronic device configured to perform decoding using a polar code in a communication system, the electronic device comprising:
    a transceiver configured to receive a signal including codeword bits that are encoded based on one polar code; and
    a decoder configured to:
        decode, in parallel, the codeword bits based on a first scheme and a second scheme to estimate information bits that correspond to the codeword bits, wherein, in the second scheme, a second codeword bit is decoded independently from a log likelihood ratio (LLR) value of a first codeword bit which is obtained in the first scheme, and wherein the first codeword bit and the second codeword bit are included in the codeword bits, and the first codeword bit precedes the second codeword bit, and
        generate data according to the decoded codeword bits; and
    transmit, via the transceiver, a response signal based on the generated data in the communication system.

9. The electronic device of claim 8, wherein the decoder is configured to, in case that a length of the codeword bits is $2^N$, sequentially obtain LLR values for bits included in each of N layers.

10. The electronic device of claim 9, wherein the decoder is configured to:
    identify an internal frozen bit based on at least one codeword frozen bit having a set value in a set position among the codeword bits, and
    obtain the LLR values for the bits of a layer sequentially from higher layers among the N layers.

11. The electronic device of claim 10, further comprising a memory configured to store the identified value of the internal frozen bit and resultant values sequentially decoded per layer.

12. The electronic device of claim 9, wherein:
    an LLR value of a first input bit in a first layer is obtained by an LLR value of a second input bit in a second layer preceding the first layer in case that the first input bit is an information bit, and
    the LLR value of the first input bit in the first layer is obtained by the LLR value of the second input bit in the second layer and a value of a frozen bit in case that the first input bit is the frozen bit.

13. The electronic device of claim 8, wherein a number of the codeword bits to be decoded in parallel is identified based on a memory capacity necessary upon decoding and latency upon decoding.

14. The electronic device of claim 8, wherein:
the first scheme is an equation below, $$L_{u_1} = \log\frac{W^-(y_1, y_2 | u_1 = 0)}{W^-(y_1, y_2 | u_1 = 1)}$$

$$= \log\frac{(W(y_1|0)W(y_2|0) + W(y_1|1)W(y_2|1))}{(W(y_1|1)W(y_2|0) + W(y_1|0)W(y_2|1))}$$

$$= 2\tanh^{-1}(\tanh(L_{x_1}/2)\tanh(L_{x_2}/2))$$

$$\approx \text{sgn}(L_{x_1})\text{sgn}(L_{x_2})\min\{|L_{x_1}|, |L_{x_2}|\} \equiv f(L_{x_1}, L_{x_2})$$

the second scheme is an equation below, $$L_{u_2} = (-1)^{\hat{u}_1} \cdot L_{x_1} + L_{x_2}$$

-continued $$= \begin{cases} \text{sgn}(L_{x_1}) \cdot (|L_{x_1}| + |L_{x_2}|) \\ \text{where } u_1 \text{ is information bit} \\ \text{sgn}(L_{x_1} + L_{x_2}) \cdot |L_{x_1} + L_{x_2}| \\ \text{where } u_1 \text{ is frozen bit and is } 0 \\ \text{sgn}(-L_{x_1} + L_{x_2}) \cdot |-L_{x_1} + L_{x_2}| \\ \text{where } u_1 \text{ is frozen bit and is } 1 \end{cases}$$

$$\equiv g'(L_{x_1}, L_{x_2})$$

$L_{u1}$ is an LLR value of the first codeword bit of a first layer,
$L_{u2}$ is an LLR value of the second codeword bit of the first layer,
$L_{x1}$ is a first input value of the first layer, and
$L_{x2}$ is a second input value of the first layer.

\* \* \* \* \*